(12) United States Patent
Webb

(10) Patent No.: US 7,645,641 B2
(45) Date of Patent: Jan. 12, 2010

(54) COOLING DEVICE WITH A PREFORMED COMPLIANT INTERFACE

(75) Inventor: Bucknell C Webb, Ossining, NY (US)

(73) Assignee: International Business Machines Corporation, Armonk, NY (US)

(*) Notice: Subject to any disclaimer, the term of this patent is extended or adjusted under 35 U.S.C. 154(b) by 58 days.

(21) Appl. No.: 11/781,854

(22) Filed: Jul. 23, 2007

(65) Prior Publication Data

US 2009/0027860 A1 Jan. 29, 2009

(51) Int. Cl.
*H01L 21/00* (2006.01)

(52) U.S. Cl. .............. 438/125; 257/E23.087

(58) Field of Classification Search ........... 438/119, 438/117, 122, 125–127; 361/710
See application file for complete search history.

(56) References Cited

U.S. PATENT DOCUMENTS

| | | | |
|---|---|---|---|
| 6,713,151 B1* | 3/2004 | Dean et al. .............. 428/86 |
| 6,890,799 B2* | 5/2005 | Daikoku et al. .............. 438/122 |
| 2001/0026957 A1* | 10/2001 | Atwood et al. .............. 438/122 |
| 2003/0143406 A1* | 7/2003 | Siegel et al. .............. 428/447 |
| 2004/0213975 A1* | 10/2004 | Scott et al. .............. 428/292.1 |
| 2006/0279935 A1* | 12/2006 | Karidis et al. .............. 361/710 |

* cited by examiner

*Primary Examiner*—Kiesha L. Rose
*Assistant Examiner*—Mark W Tornow
(74) *Attorney, Agent, or Firm*—Michael J. Buchenhorner; Vazken Alenanian

(57) ABSTRACT

An integrated circuit package includes: a substrate; an electronic circuit located on the substrate, the electronic circuit comprising a topography of at least one level; a cooling device located over the electronic circuit; a compliant interface disposed between the electronic circuit and the cooling device, wherein the compliant interface comprises a first surface and a second surface and wherein the first surface is in thermal contact with the electronic circuit, and wherein the compliant interface is preformed from a compliant material such that the first surface substantially conforms to the topography of the electronic circuit.

7 Claims, 6 Drawing Sheets

COOLING DEVICE WITH A PREFORMED COMPLIANT INTERFACE

CROSS-REFERENCE TO RELATED APPLICATIONS

This application relates to technology similar to that discussed in U.S. patent application Ser. No. 11/151,905, "Cooling Structure Using Rigid Movable Elements;" U.S. patent application Ser. No. 11/151,830, "Compliant Thermal Interface Structure Utilizing Spring Elements;" U.S. patent application Ser. No. 11/151,843, "Compliant Thermal Interface Structure Utilizing Spring Elements and Fins;" and U.S. patent application Ser. No. 11/151,831, "Compliant Thermal Interface Structure with Vapor Chamber;" all of which are herein incorporated by reference.

STATEMENT REGARDING FEDERALLY SPONSORED-RESEARCH OR DEVELOPMENT

Not Applicable.

INCORPORATION BY REFERENCE OF MATERIAL SUBMITTED ON A COMPACT DISC

Not Applicable.

FIELD OF THE INVENTION

The invention disclosed broadly relates to the field of electronic devices and more particularly relates to the field of compliant interfaces for cooling electronic devices.

BACKGROUND OF THE INVENTION

During the normal operation of a computer, integrated circuit devices (ICs) generate significant amounts of heat. This heat must be continuously removed, or the integrated circuit device may overheat, resulting in damage to the device and/or a reduction in operating performance. Cooling devices, such as heat sinks, have been used in conjunction with ICs in order to avoid such overheating. Generally, a passive heat sink in combination with a system fan has provided a relatively cost-effective cooling solution. In recent years, however, the power of ICs has increased exponentially, resulting in a significant increase in the amount of heat generated by these devices, thereby making it extremely difficult to extract heat from these devices in order to cool them.

Heat is typically extracted by coupling a heat spreader and a thermal cap to the electronic device as a heat sink. Heat sinks operate by conducting heat from a processor to the heat sink and then radiating it into the ambient air. The better the transfer of heat between the two surfaces (the processor and the heat sink metal) the better the cooling. Some processors come with heat sinks attached to them directly, or interfaced through a thin and soft layer of thermal paste, ensuring a good transfer of heat between the processor and the heat sink. The thermal paste serves not only to transfer heat but to provide some degree of mechanical compliance to compensate for dimensional changes driven by the high operating temperatures of the devices. However, the paste is a weak link in the thermal path. Attempts to thin this layer have resulted in failure of the layer when it is exposed to dimensional changes. There are some known mechanically compliant solutions but these solutions still rely on paste film somewhere in the path.

Printed circuit boards are constructed of various components, some of which have varying coefficients of thermal expansion (CTE). When the components are heated, this can produce degradation such as cracking in some of the components. This is a common problem with solder balls. In addition to the problem of varying CTEs, the different components are usually of varying heights. This adds additional air gaps between current interfaces and circuits, in addition to the air gaps that exist between the components. Heat conduction across air gaps is generally poor, thereby lessening the effectiveness of the heat sink.

In some applications (silicon carrier, multichip modules), it would be desirable to cool several adjacent chips of different thicknesses and perhaps interspersed with capacitors and other components.

Thus, there is a need for a solution that overcomes these shortcomings.

SUMMARY OF THE INVENTION

Briefly, according to an embodiment of the present invention, an integrated circuit package includes: a substrate; an electronic circuit located on the substrate, the electronic circuit comprising a multi-level topography; a cooling device located over the electronic circuit; a compliant interface disposed between the electronic circuit and the cooling device; the compliant interface comprising a surface making contact with the electronic circuit, and preformed from a compliant material such that the surface substantially conforms to multi-level topography.

In yet another embodiment of the present invention, a method for cooling an electronic device comprises steps of placing an electronic circuit on a substrate, the electronic circuit comprising a multilevel topography; preforming a compliant interface from a compliant material such that a surface conforms to multi-level topography comprising a surface making contact with the electronic circuit; and loading the compliant interface over the electronic circuit.

BRIEF DESCRIPTION OF THE DRAWINGS

The subject matter, which is regarded as the invention, is particularly pointed out and distinctly claimed in the claims at the conclusion of the specification. The foregoing and other features and also the advantages of the invention will be apparent from the following detailed description taken in conjunction with the accompanying drawings. Additionally, the left-most digit of a reference number identifies the drawing in which the reference number first appears.

DETAILED DESCRIPTION

We describe a preformed, compliant thermal interface for cooling an electronic device to achieve low thermal resistance and high mechanical compliance. This interface is constructed with a material flexible enough to be shaped, yet robust enough to last many cycles without a degradation in performance. The compliant properties of the interface reduce mechanical stresses brought about by differences in the coefficient of thermal expansion (CTE) of different materials used in the construction of chips and cooling devices. This compliance also addresses the problem of cracked solder balls.

A first surface of the interface is preformed to match the contours of the printed circuit board to which it will be affixed. Preforming the interface to match the topography of the circuit board creates an effective thermal seal over any circuit shape, ranging from flat to multi-level. This reduces air gaps, thereby increasing heat conduction away from the chip or chips. This interface may be constructed to fit over more than one chip and other structures as well.

According to another embodiment of the present invention, a second surface of the interface can also be preformed. In this embodiment, the second surface is preformed to match the contours of a heat sink. The interface may be preformed on only one surface, or on both the first and second surfaces.

Figure 1:
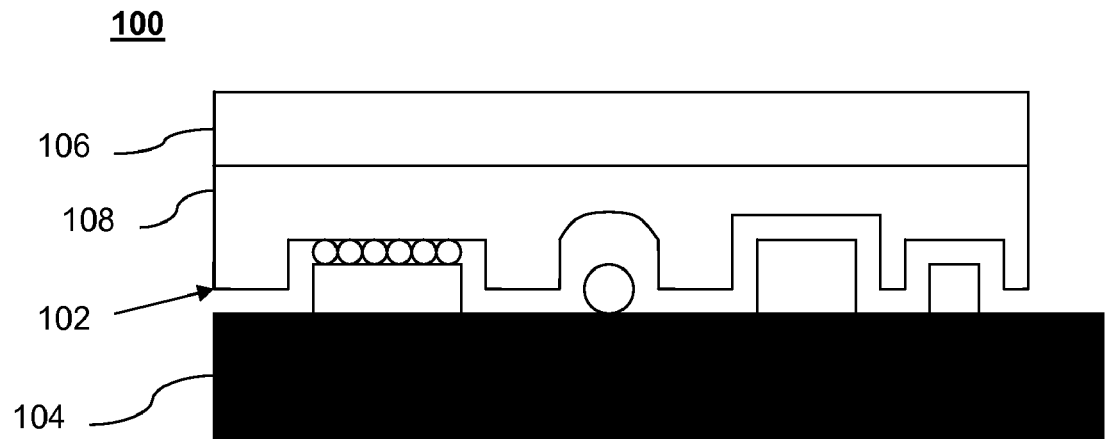
FIG. 1 shows a cross section of an integrated circuit patent with a compliant interface according to an embodiment of the invention.

FIG. 1 shows a cross sectional side view of a cooling structure 100 for an electronic circuit 102. The electronic circuit 102 is deposited on a substrate 104. The electronic circuit 102 comprises one or more chips and various components forming a multilevel topology. A heat sink 106 is used to cool the electronic circuit 102. A compliant interface 108 is disposed between the circuit 102 and the heat sink 106. The compliant interface 108 is preformed to the topography of the circuit 102 so that it interlocks with the circuit 102, matching the contours of the circuit 102, when it is placed over the circuit 102.

Figure 2:
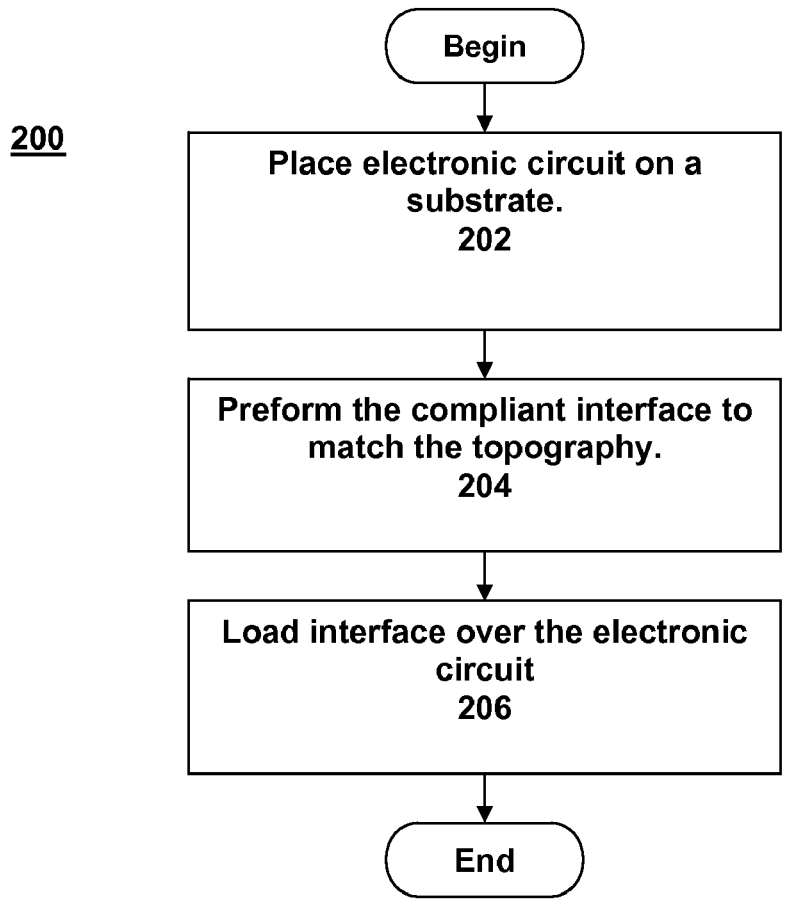
FIG. 2 is a flowchart illustrating a method according to an alternate embodiment of the invention.

FIG. 2 is a flowchart illustrating a method 200 according to an embodiment of the invention. The method begins with step 202: placing the electronic circuit on a substrate. The electronic circuit 102 has a topography that can range from flat to multi-level.

Step 204 preforms a compliant interface from a compliant material such that a surface of the material conforms to the multi-level topography of the electronic circuit. The steps for performing the interface 108 will be discussed in detail with respect to the discussion of the flow charts of FIGS. 3 and 4. Preforming the compliant surface to match the chip topography is feasible for many cooling manufacturing approaches, specifically where the fins, wires or springs that support and carry heat away from the interface are initially potted (encapsulated) in a material that is removed later, such as plastic, and the interface is deposited by plating. For such a structure the surface could be machined to match the expected topography, with tapers introduced to avoid load peaks, and then plated. The tapers are used for tapering the thickness change.

As illustrated in FIGS. 5 and 6, the solid plastic is removed after plating, leaving a relatively thin metal interface supported by the fins, wires or springs. Alternatively for malleable plastics, a baseplate matching the topography could be made and the entire sheet of plastic with its internal metal structure pressed to fit the baseplate.

Step 206 loads the compliant interface 108 over the electronic circuit 102. A thermal paste or thermal grease may be used in conjunction with this interface 108. The interface 108 may be affixed to the heat sink by conventional means or it may be part of the structure of the heat sink.

Figure 3:
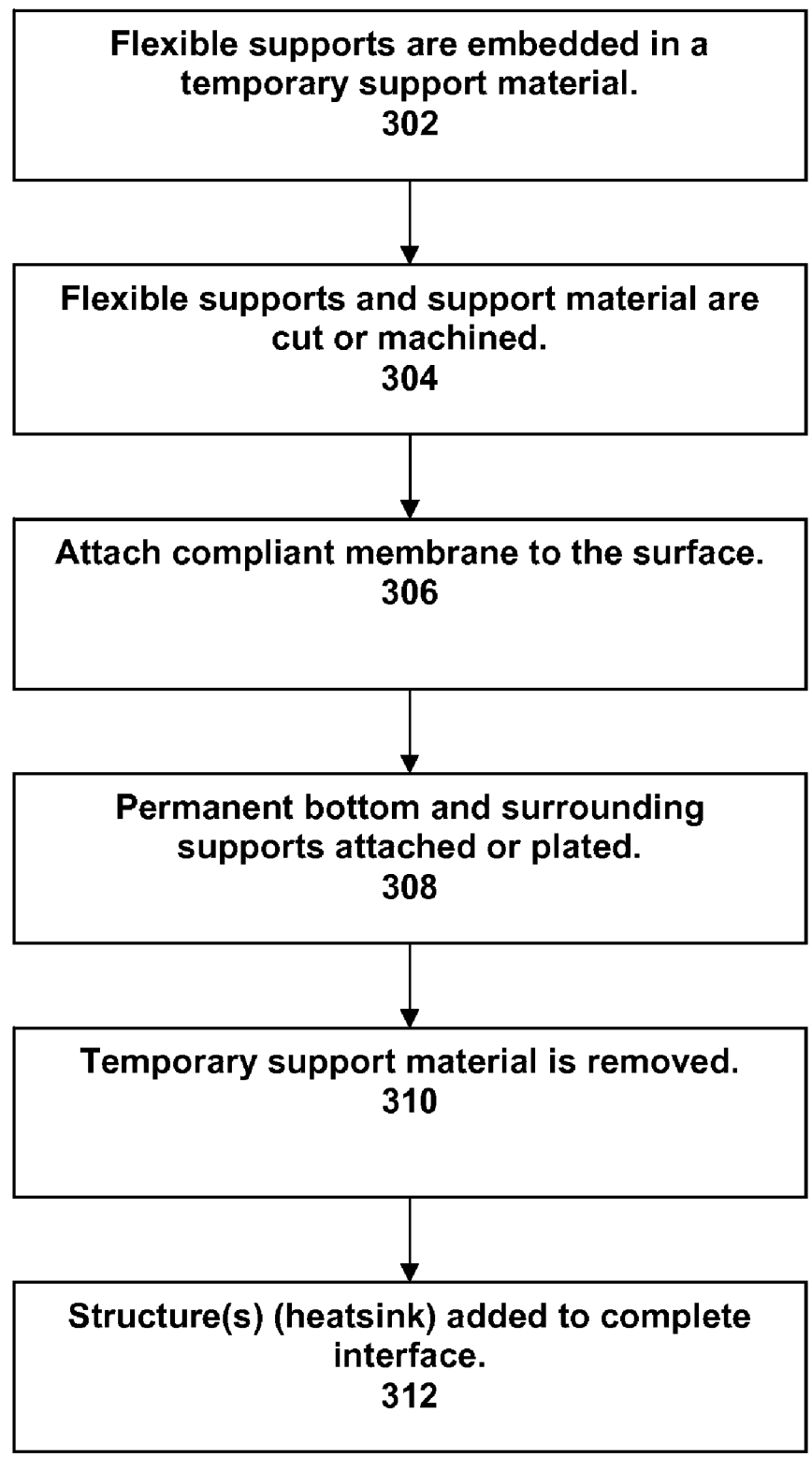
FIG. 3 is a flowchart of the steps of preforming the compliant interface from step 202 of FIG. 2, according to an embodiment of the present invention.

As stated in step 204, one embodiment for preforming the compliant interface 108 with a preformed multilevel topography as shown in FIG. 1 is detailed in the flowchart of FIG. 3 and illustrated in FIGS. 5a-d.

Figure 5A:
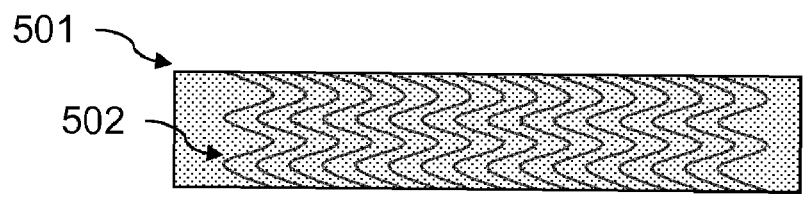
FIG. 5a shows flexible supports embedded in a temporary support material, according to an embodiment of the present invention.

In step 302, flexible supports 502 for the compliant interface 108 are embedded in a temporary support material such as a plastic or metal 501. This is shown in FIG. 5a which shows the preformed surface (the surface in contact with the device).

Figure 5B:
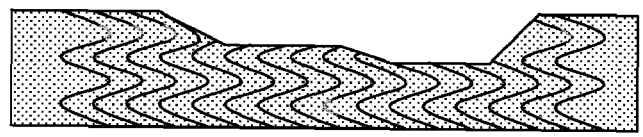
FIG. 5b shows the shaped flexible supports, according to an embodiment of the present invention.
Figure 5C:
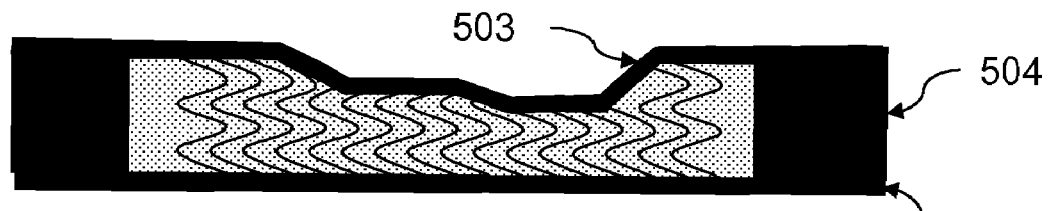
FIG. 5c shows a compliant membrane attached to the surface, according to an embodiment of the present invention.
Figure 5D:
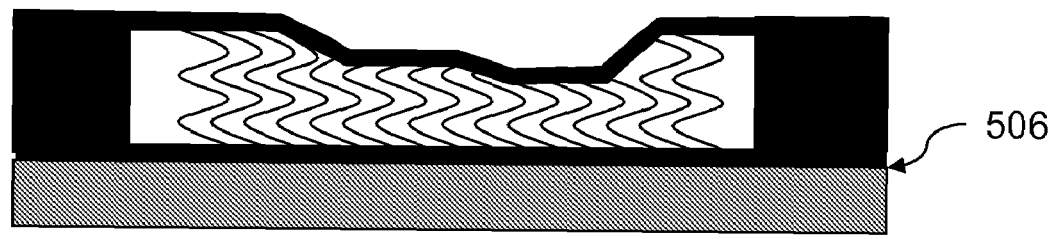
FIG. 5d shows the addition of a permanent bottom and temporary supports, according to an embodiment of the present invention.

Next, in step 304 (as shown in FIG. 5b), the support material and flexible supports 502 are cut or machined to conform to the shape of the desired multilevel topography. Once cut, in step 306, a compliant membrane 503 is attached or plated onto the surface of the temporary support material. The compliant membrane 503 is important for contact surface area as described above. A thermally conducting metal is the preferred material for this membrane 503. In step 308 a permanent bottom 505 and surrounding supports 504 are attached or plated as shown in FIG. 5c.

In step 310 (see FIG. 5d) the structure is completed by removal of the temporary support material. This is done by either melting or chemical methods and in step 312 the addition of structures 506 to complete a heatsink, water manifold or vapor chamber structure is attached depending on the compliant membrane device type. Materials for this compliant membrane 503 are preferably metal, such as copper, but could be partly or mostly nickel, gold, silver, or other metals with good thermal conductivity and malleability. Carbon film may also be used.

Figure 4:
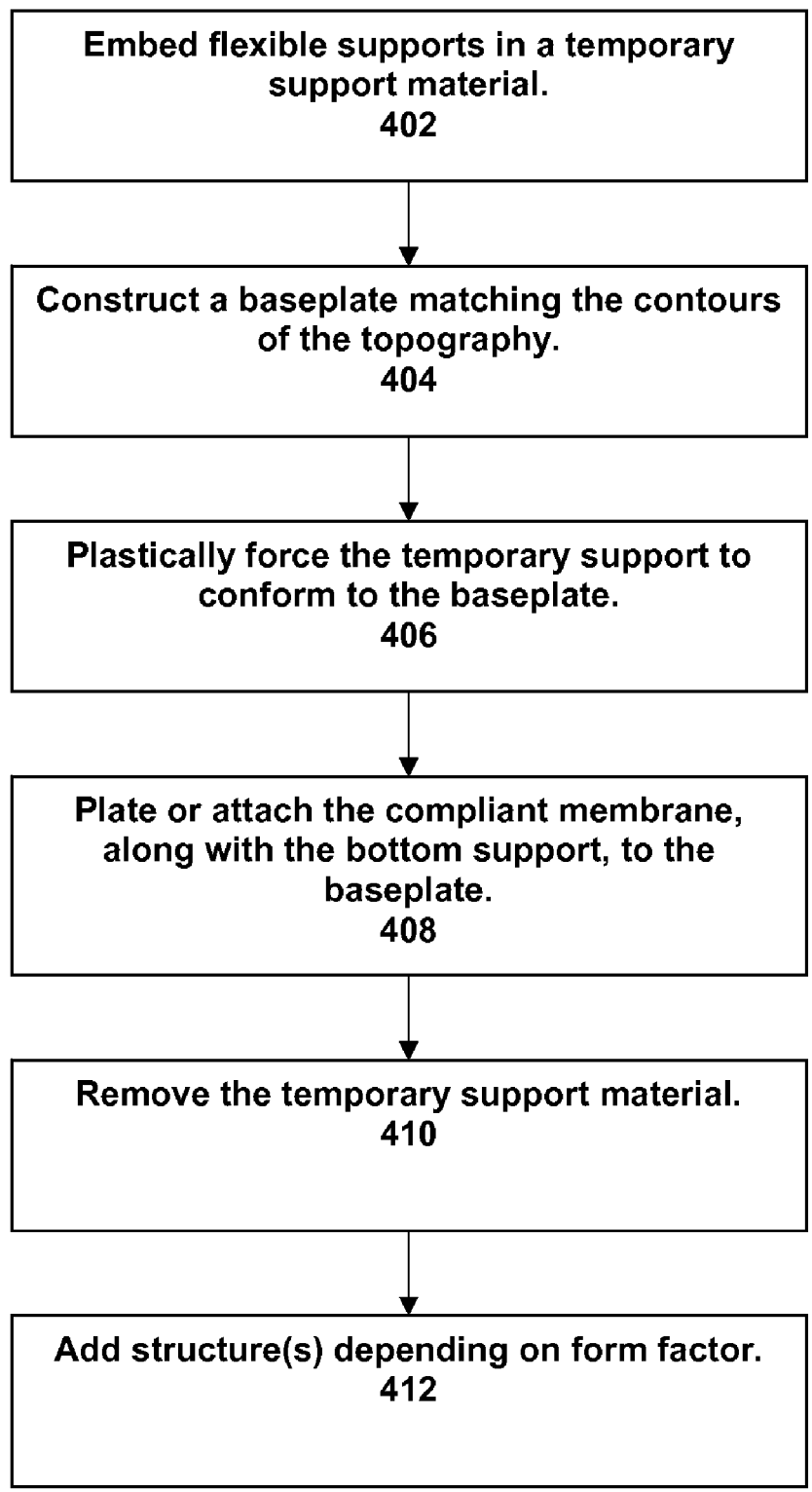
FIG. 4 is a flowchart of the steps for performing the compliant interface from step 202 of FIG. 2, according to another embodiment of the present invention.
Figure 6A:
FIG. 6a shows the flexible supports of another embodiment of the present invention.
Figure 6B:
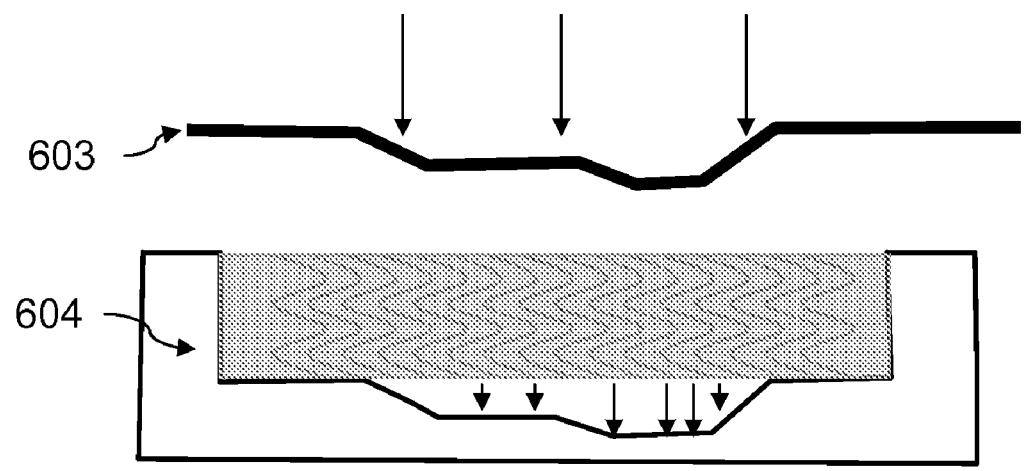
FIG. 6b shows a baseplate constructed to match the contours of a topography, according to an embodiment of the present invention.

Referring to FIG. 4 there is shown a flow chart for another embodiment of a method for construction of a multilevel compliant interface device. The process begins with step 402 wherein flexible supports 602 for the compliant interface are embedded in a temporary support material such as a plastic or metal 601, as shown in FIG. 6d (which shows both surfaces preformed). Next, in step 404, a baseplate 604 is made conforming to the desired multilevel topography as shown in FIG. 6b.

Figure 6C:
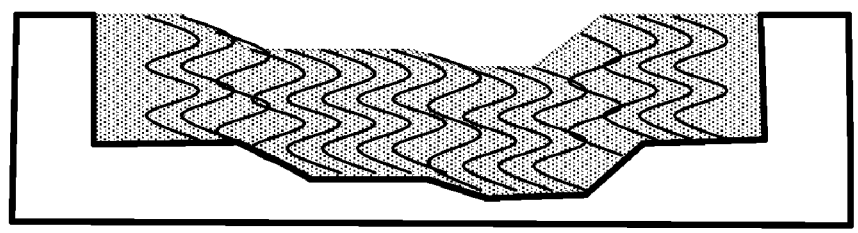
FIG. 6c shows the temporary support plastically forced to conform to the baseplate, according to an embodiment of the present invention.
Figure 6D:
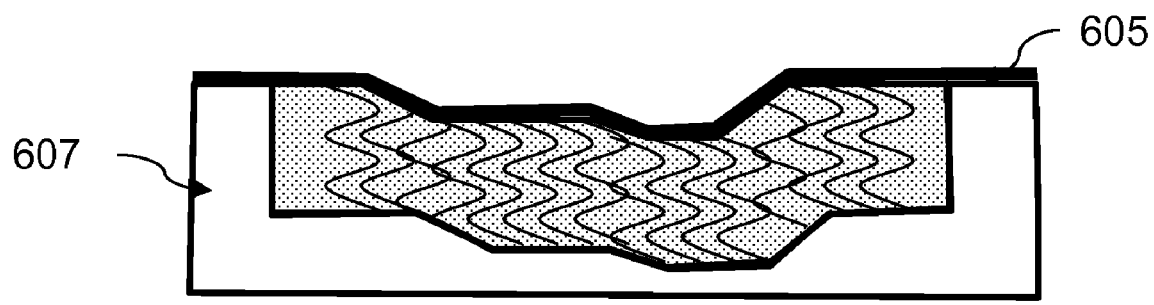
FIG. 6d shows the compliant membrane, according to an embodiment of the present invention.
Figure 6E:
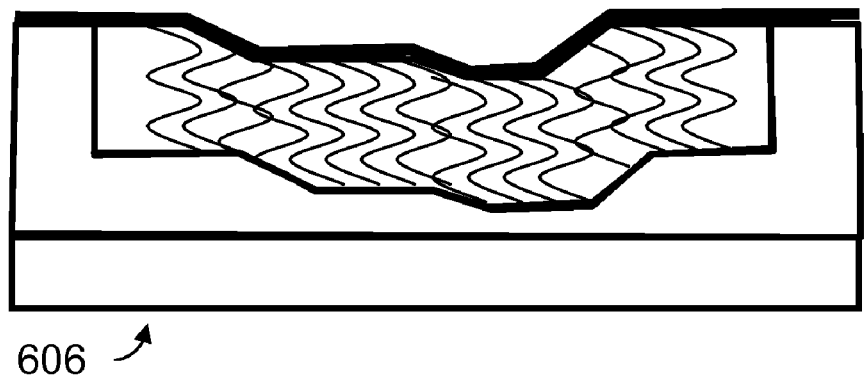
FIG. 6e shows the interface with the temporary support material removed, according to an embodiment of the present invention.

Following this, in step 406 a mandrel (a device for the formation of cavities) 603 matching the desired topography for a compliant material is used to plastically force the temporary support to conform to the baseplate 604 as shown in FIG. 6c.

In step 408 (see FIG. 6d) the compliant membrane 605 is plated or attached along with a bottom support which may also be a plated membrane attached to a baseplate 607. This baseplate 607 may or may not be the same as the baseplate 604. Next in step 410 the temporary support material is removed by melting or chemical methods (see FIG. 6e). In step 412 the structure is completed by the addition of structure (s) 606 to complete a heatsink, water manifold or vapor chamber structure attached depending on the compliant membrane device type, also shown in FIG. 6*e*.

Therefore, while there have been described what are presently considered to be the preferred embodiments, it will be understood by those skilled in the art that other modifications can be made within the spirit of the invention.

I claim:

1. A method comprising steps of:
    placing an electronic circuit on a substrate, the electronic circuit comprising a topography of more than one level;
    preforming a first surface of a compliant interface to the topography of the electronic circuit; wherein the compliant interface is constructed from a compliant material and wherein said preforming comprises steps of:
        embedding flexible supports in a temporary support material, wherein said temporary support material is sized according to dimensions of the electronic circuit;
        shaping a first surface of the temporary support material according to the topography of the electronic circuit;
        attaching a compliant membrane to the first surface of the temporary support material;
        attaching a permanent bottom structure to the temporary support material;
        attaching surrounding supports to the temporary support material; and
        removing the temporary support material; and
    loading the preformed compliant interface over the electronic circuit so that the preformed compliant interface interlocks with the electronic circuit, matching contours of the electronic circuit when said preformed compliant interface is loaded over said electronic circuit.

2. The method of claim 1 further comprising a step of:
    applying a thermal interface material between the electronic circuit and the compliant interface.

3. The method of claim 1 further comprising machining the first surface of the compliant interface to approximately match the topography of the electronic circuit.

4. The method of claim 1 wherein the preforming step further comprises a step of:
    preforming a second surface of the compliant interface such that the second surface substantially conforms to a topography of a device in thermal contact with the second surface.

5. The method of claim 4 further comprising a step of:
    affixing a structure to the second surface of the compliant interface.

6. The method of claim 1 wherein the step of preforming the compliant interface further comprises steps of:
    constructing a baseplate matching the topography of the electronic circuit;
    forcing the temporary support material to conform to the baseplate;
    attaching a compliant membrane and a bottom support to the baseplate; and
    removing the temporary support material.

7. The method of claim 6 further comprising a step of:
    affixing a structure to the second surface of the compliant interface.

* * * * *